United States Patent
Casler et al.

(10) Patent No.: US 8,816,185 B2
(45) Date of Patent: Aug. 26, 2014

(54) PHOTOVOLTAIC MODULE

(75) Inventors: Joseph Casler, Saint Clair Shores, MI (US); Brian E. Cohen, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 723 days.

(21) Appl. No.: 12/903,809

(22) Filed: Oct. 13, 2010

(65) Prior Publication Data

US 2011/0088742 A1   Apr. 21, 2011

Related U.S. Application Data (60) Provisional application No. 61/251,461, filed on Oct. 14, 2009.

(51) Int. Cl.
*H02N 6/00*   (2006.01)
*H01L 31/042*   (2014.01)
*H01L 31/00*   (2006.01)

(52) U.S. Cl.
USPC ........... 136/244; 136/252; 136/256; 136/260; 136/264

(58) Field of Classification Search
USPC ................. 136/244, 249, 252, 256, 260, 264
See application file for complete search history.

(56) References Cited

U.S. PATENT DOCUMENTS

| | | |
|---|---|---|
| 5,457,057 A | 10/1995 | Nath et al. |
| 5,593,901 A | 1/1997 | Oswald et al. |
| 5,679,176 A | 10/1997 | Tsuzuki et al. |
| 2002/0016016 A1 | 2/2002 | Tsuzuki et al. |
| 2009/0260671 A1 | 10/2009 | Green et al. |
| 2010/0307560 A1* | 12/2010 | Baker et al. .................... 136/244 |
| 2010/0307561 A1* | 12/2010 | Buller et al. ................... 136/244 |
| 2010/0307568 A1* | 12/2010 | Cheng et al. ................... 136/251 |
| 2010/0326491 A1* | 12/2010 | Cheng et al. ................... 136/244 |

FOREIGN PATENT DOCUMENTS

| | | |
|---|---|---|
| CN | 1082727 C | 4/2002 |
| JP | 2005-353767 A | 12/2005 |
| WO | WO2008/051275 | 5/2008 |
| WO | WO2008/080160 | 7/2008 |
| WO | WO 2009/076403 A1 | 6/2009 |

* cited by examiner

*Primary Examiner* — Jonathan Johnson
*Assistant Examiner* — Lindsey Bernier
(74) *Attorney, Agent, or Firm* — Dickstein Shapiro LLP (57) ABSTRACT

A photovoltaic module may include a transparent conductive layer on a substrate a first submodule including a first plurality of photovoltaic cells connected in series and a second submodule including a second plurality of photovoltaic cells connected in series.

28 Claims, 6 Drawing Sheets

PHOTOVOLTAIC MODULE

CLAIM FOR PRIORITY

This application claims priority under 35 U.S.C. §119(e) to U.S. Provisional Patent Application Ser. No. 61/251,461 filed on Oct. 14, 2009, which is hereby incorporated by reference.

TECHNICAL FIELD

The present invention relates to photovoltaic modules and methods of production.

BACKGROUND

Photovoltaic modules are typically used in arrays of interconnected submodules. Each submodule is comprised of individual solar cells, typically connected in series. Thin film photovoltaic modules are formed by the deposition of multiple semiconductor or organic thin films on rigid or flexible substrates or superstrates. Electrical contact to the solar cell material on the substrate side is provided by an electrically conductive substrate material or an additional electrically conductive layer between the solar cell material and the substrate such as a transparent conductive layer.

DETAILED DESCRIPTION

A photovoltaic module may include a transparent conductive layer on a substrate; a first submodule including a first plurality of photovoltaic cells connected in series; a second submodule including a second plurality of photovoltaic cells connected in series, where the first and second submodules are connected in parallel and contacting the transparent conductive layer through a shared cell; a first strip of tape having a length distributed along a contact region on the first and second submodules, where the first strip of tape includes a front surface and a back surface, where each surface contains an adhesive; a first lead foil distributed along the length of the first strip of tape; a second strip of tape, having a length shorter than that of the first strip of tape, distributed along the length and between the ends of the first strip of tape, where the second strip of tape includes a front and back surface, each containing an adhesive; a second lead foil, having a length shorter than that of the second strip of tape, distributed along the length of the second strip of tape; and a plurality of parallel bus bars, positioned adjacent and perpendicular to the first and second strips of tape, where each one of the plurality of parallel bus bars contacts one of the first or second lead foils.

The photovoltaic module may have various optional features. For example, the photovoltaic module may include between about 140 and about 180 cells. The photovoltaic module may include about 144, about 156, or about 176 photovoltaic cells. Each one of the plurality of parallel bus bars may be positioned approximately equidistant from at least another one of the plurality of parallel bus bars. The plurality of parallel bus bars may include three bus bars. The plurality of parallel bus bars may include two positively charged bus bars, and one negatively charged bus bar positioned between the two positively charged bus bars. The negatively charged bus bar may physically contact the second lead foil, and the positively charged bus bars may physically contact separate portions of the first lead foil. Each one of the plurality of parallel bus bars may include a copper. Each one of the plurality of parallel bus bars may include a width of more than about 10 mm. Each one of the plurality of parallel bus bars may include a width of less than about 13 mm.

The shared cell may be positioned in a center between the first and second submodules. The second strip of tape may be positioned directly on the shared cell. Each one of the first and second plurality of photovoltaic cells may include a cadmium telluride on a cadmium sulfide. Each one of the plurality of parallel bus bars may include a copper. The first or second strip of tape may have a thickness of about 0.0005 to about 0.0100 inches. The first or second strip of tape may have a thickness of about 0.0010 to about 0.0045 inches. The first or second strip of tape may have a thickness of about 0.0012 inches to about 0.0020 inches, for example, about 0.0015 inches. The contact region may include a trench pattern, defining each one of the first and second plurality of photovoltaic cells. The trench pattern may extend substantially through one layer. The trench pattern may extend substantially through two layers. The trench pattern may extend substantially through three layers. At least one of the first or second plurality of photovoltaic cells may have a width of about 6 to about 10 mm. At least one of the first or second plurality of photovoltaic cells may have a width of about 7 to about 8 mm. At least one of the first or second plurality of photovoltaic cells may have a width of about 7.1 mm to about 7.5 mm, such as about 7.24 mm. The shared cell may have a width of about 10 mm to about 20 mm, such as about 15 mm. The first lead foil may include a loop extending in a substantially orthogonal direction away from a top surface of the photovoltaic module. The loop may include a peak located about 20 mm to about 25 mm above the first strip of tape. The loop may include a peak located more than about 20 mm above the first strip of tape. The loop may include a peak located less than about 25 mm above the first strip of tape.

A method for manufacturing a photovoltaic module may include applying a first strip of tape having a length along a contact region of a first and second submodule connected in parallel through a shared cell, where the first submodule includes a first plurality of photovoltaic cells connected in series, and the second submodule includes a second plurality of photovoltaic cells connected in series; applying a first lead foil along the length of the first strip of tape; applying a second strip of tape along the length and between the ends of the first strip of tape, where the second strip of tape has a length shorter than that of the first strip of tape; applying a second lead foil having a length shorter than that of the second strip of tape, along the length of the second strip of tape; and applying a plurality of parallel bus bars adjacent and perpendicular to the first and second strips of tape, where each one of the plurality of parallel bus bars contacts one of the first or second lead foils.

The method may have various optional features. For example, applying the first strip of tape may include positioning a strip of tape on one or more contact metals, where each one of the first and second plurality of photovoltaic cells includes a contact metal. Applying a plurality of parallel bus bars may include positioning at least one of the plurality of parallel bus bars approximately equidistant from at least another one of the plurality of parallel bus bars. The method may include forming a trench pattern in a contact region, where the first and second submodules include a contact region, and where the trench pattern defines each photovoltaic cell in the first and second plurality of photovoltaic cells. The forming may include laser ablation, laser scribing, wet-chemical etching, or dry etching. The method may include forming a loop, and extending the loop in a substantially orthogonal direction away from a top surface of the photovoltaic module, where the first lead foil comprises the loop.

A photovoltaic module can include a transparent conductive oxide layer adjacent to a substrate and layers of semiconductor material. The layers of semiconductor material can include a bi-layer, which may include an n-type semiconductor window layer, and a p-type semiconductor absorber layer. The n-type window layer and the p-type absorber layer may be positioned in contact with one another to create an electric field. Photons can free electron-hole pairs upon making contact with the n-type window layer, sending electrons to the n side and holes to the p side. Electrons can flow back to the p side via an external current path. The resulting electron flow provides current, which combined with the resulting voltage from the electric field, creates power. The result is the conversion of photon energy into electric power. To preserve and enhance device performance, numerous layers can be positioned above the substrate in addition to the semiconductor window and absorber layers.

Photovoltaic modules can be formed on optically transparent substrates, such as glass. Because glass is not conductive, a transparent conductive oxide (TCO) layer is typically deposited between the substrate and the semiconductor bi-layer. Cadmium stannate functions well in this capacity, as it exhibits high optical transmission and low electrical sheet resistance. A smooth buffer layer can be deposited between the TCO layer and the semiconductor window layer to decrease the likelihood of irregularities occurring during the formation of the semiconductor window layer. Additionally, a barrier layer can be incorporated between the substrate and the TCO layer to lessen diffusion of sodium or other contaminants from the substrate to the semiconductor layers, which could result in degradation and delamination. The barrier layer can be transparent, thermally stable, with a reduced number of pin holes and having high sodium-blocking capability, and good adhesive properties. Therefore the TCO can be part of a three-layer stack, which may include, for example, a silicon dioxide barrier layer, a cadmium stannate TCO layer, and a buffer layer (e.g., a tin (IV) oxide). The buffer layer can include various suitable materials, including tin oxide, zinc tin oxide, zinc oxide, and zinc magnesium oxide. A photovoltaic module can include a cadmium sulfide window layer deposited over a TCO stack and a cadmium telluride absorber layer deposited over the cadmium sulfide layer. Cadmium telluride photovoltaic modules offer several advantages over other photovoltaic technologies. Among those are superior light absorption properties under cloudy and diffuse light conditions and ease of manufacturing.

A photovoltaic system may include several modules. A module may include two or more submodules connected in parallel. A submodule may include a plurality of individual cells connected in series. Photovoltaic modules can be used in arrays of multiple, interconnected modules.

Figure 1:
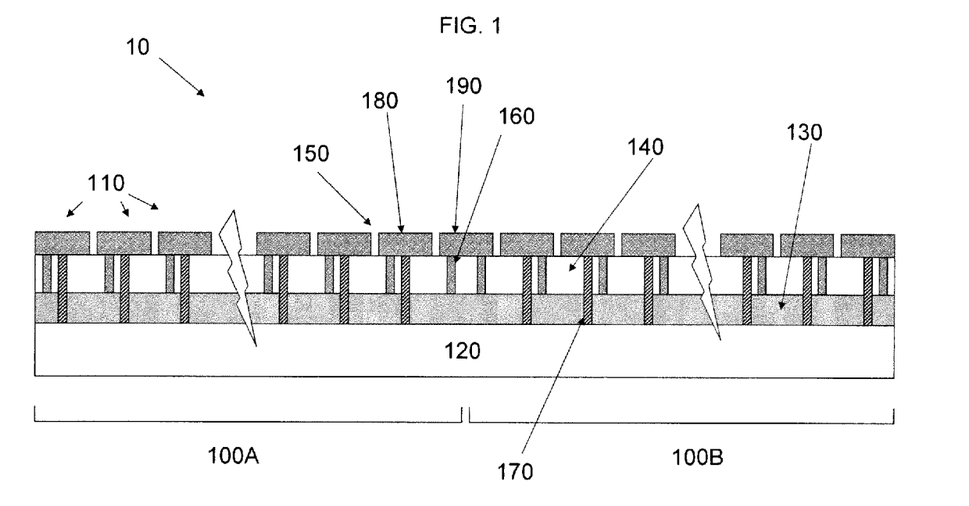
FIG. 1 is a schematic of two photovoltaic submodules connected in parallel.

Referring to FIG. 1, by way of example, a photovoltaic system can include a photovoltaic module 10, which can be formed by connecting a first submodule 100A and a second submodule 100B. Each submodule can include a plurality of photovoltaic cells 110 connected in series. Photovoltaic module 10 can include a transparent conductive layer 130 on a substrate 120. Transparent conductive layer 130 can include any suitable material, including a transparent conductive oxide. For example, transparent conductive layer 130 may include a cadmium stannate. Substrate 120 can include any suitable substrate material. For example, substrate 120 may include a glass. Photovoltaic module 10 may include one or more semiconductor layers 140 deposited on transparent conductive layer 130. Semiconductor layer 140 may include a cadmium telluride on a cadmium sulfide. A contact metal 180 can be deposited onto semiconductor layer 140. Substrate 120, transparent conductive layer 130, semiconductor layer 140, and contact metal 180 can all be part of first submodule 100A and second submodule 100B. Submodules 100A and 100B can be scribed to form one or more trenches. For example, a trench 150 can be scribed into contact metal 180 to delineate photovoltaic cells 110. Trench 160 can be scribed to create a via into which contact metal 180 can flow to create electrical contact with transparent conductive layer 130. Trench 170 can be scribed, and an insulator can be deposited therein. The insulator can include any suitable material, including a dielectric material, atmosphere or a vacuum. The insulator can be in a constant position among photovoltaic cells connected in series. The insulator can penetrate the semiconductor material, the transparent conductive layer, or both. The insulator can have a length that spans the length of a semiconductor material and a transparent conductive layer combined. Submodules 100A and 100B can thus each have 3 different trench patterns for each photovoltaic cell 110. The trench patterns can be formed using any suitable method, including, for example, laser ablation, laser scribing, wet-chemical etching, or dry etching.

Photovoltaic module 10 can include a shared cell 190 at the center between first and second submodules 100A and 100B. Shared cell 190 can be flanked by two electrical contacts 160 between transparent conductive layer 130 and contact metal 180. Shared cell 190 can connect submodules 100A and 100B in parallel. Thus the total current output of photovoltaic module 10 can be the sum of the currents of each submodule.

The parallel interconnection of submodules 100A and 100B, as shown in FIG. 1, can be obtained by allowing both submodules to share the contact to transparent conductive layer 130 on substrate 120. First submodule 100A and second submodule 100B can be connected in parallel and contacted to transparent conductive layer 130 through shared cell 190. First submodule 100A can have an electrical contact region including a first trench pattern, where the first trench pattern is a pattern of photovoltaic cells connected in series, and a last cell in the series is the shared cell. Second submodule 100B can have an electrical contact region including a second trench pattern, where the second trench pattern is a minor image of the first trench pattern, the minor image having symmetry about the shared cell. This structure can be applied to any number of submodules, N (where N is a natural number greater than 1). The output voltage of the module will decrease proportionally with N. This provides the ability to control the output voltage of the modules to optimally meet a solar array's system requirements.

Photovoltaic module 10 can have any suitable number of photovoltaic cells. For example, photovoltaic module 10 can include about 144, about 154, or about 176 cells. A lower cell count, for example, 144 cells, can result in a lower open circuit voltage which is more suitable for operating in cold climates. The cell count may also be modified to lower resistive loss, thus resulting in a higher fill factor. The cells of photovoltaic module 10 may have any suitable width. For example, one or more of the cells may have a width between about 7 to about 8 mm, for example, about 7.1 mm to about 7.5 mm, such as about 7.24 mm. Shared cell 190 may have a larger width, for example, about 10 mm to about 20 mm, such as about 15 mm.

Figure 2:
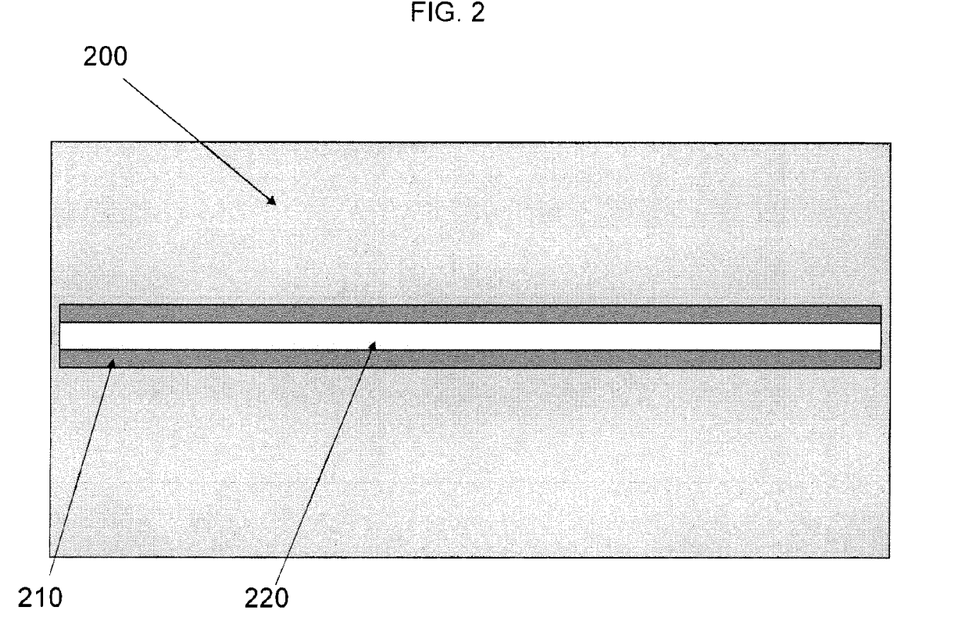
FIG. 2 is a schematic of a photovoltaic module including double-sided tape and lead foil.

Referring to FIG. 2, a bus bar assembly can be attached to the contact metal side of photovoltaic module 10. A first double-sided tape strip 210 can be applied to metal surface 200, and a first lead foil 220 can be applied thereon. First tape strip 210 can include an adhesive on its front and back sides. First tape strip 210 can have any suitable thickness. For example, first tape strip 210 can have a thickness in a range of about 0.0005 to about 0.0100 inches, or about 0.0010 to about 0.0045 inches. First tape strip 210 can have a thickness of more than about 0.0005 inches, or less than about 0.0100 inches. For example, first tape strip 210 can have a thickness of about 0.0012 inches to about 0.0020 inches, for example, about 0.0015 inches. A smaller tape thickness can minimize stress on the module from the tape layout.

Figure 3:
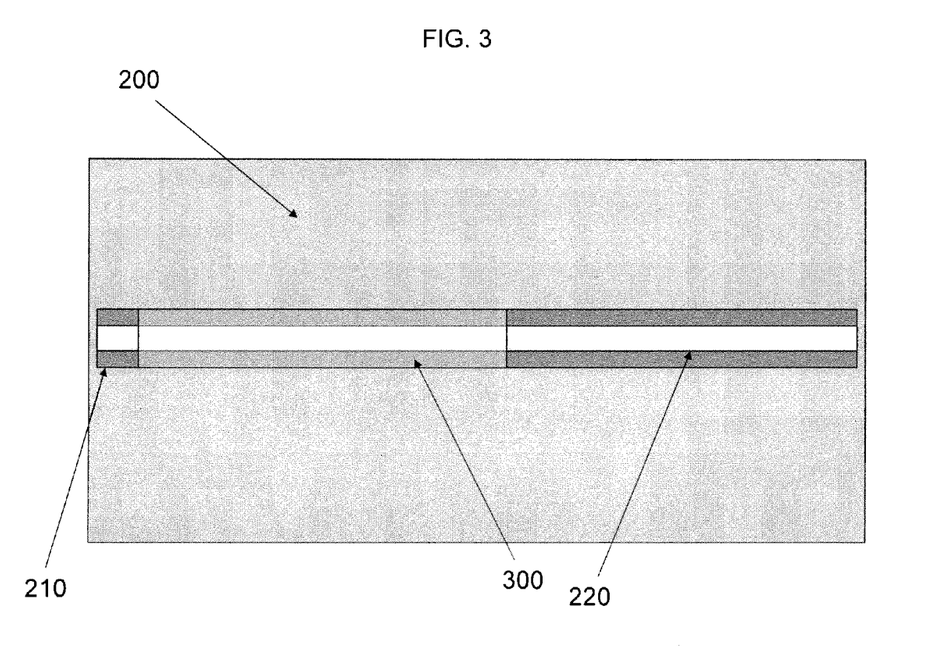
FIG. 3 is a schematic of a photovoltaic module including double-sided tape and lead foil.

Referring to FIG. 3, a second strip of double-sided tape 300 can be applied along first tape strip 210. Second tape strip 300 can have a length substantially shorter than that of first tape strip 210. For example, second tape strip 300 can have a length that is approximately half that of first tape strip 210. Second tape strip 300 can have a length substantially the same as first tape strip 210. Second tape strip 300 can cover a portion of first lead foil 220. When second tape strip 300 covers a portion of first lead foil 220, second tape strip 300 can act as a corrosion barrier to prevent or reduce corrosion of first lead foil 220. Second tape strip 300 can be positioned such that an end of second tape strip 300 is approximately one cell past the center of first tape strip 210.

Figure 4:
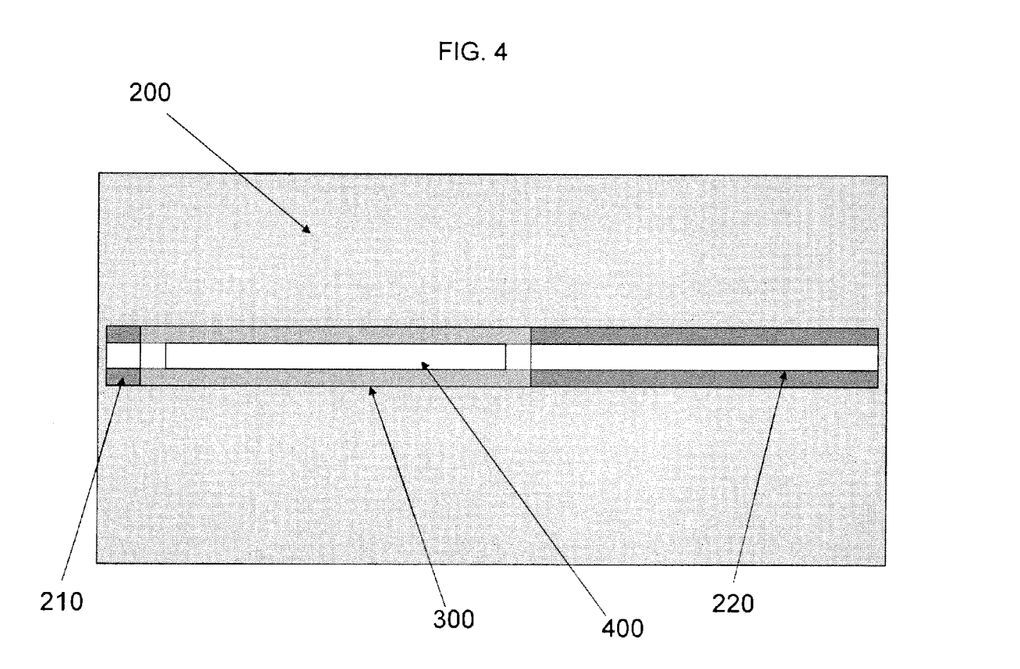
FIG. 4 is a schematic of a photovoltaic module including double-sided tape and lead foil.
Figure 5:
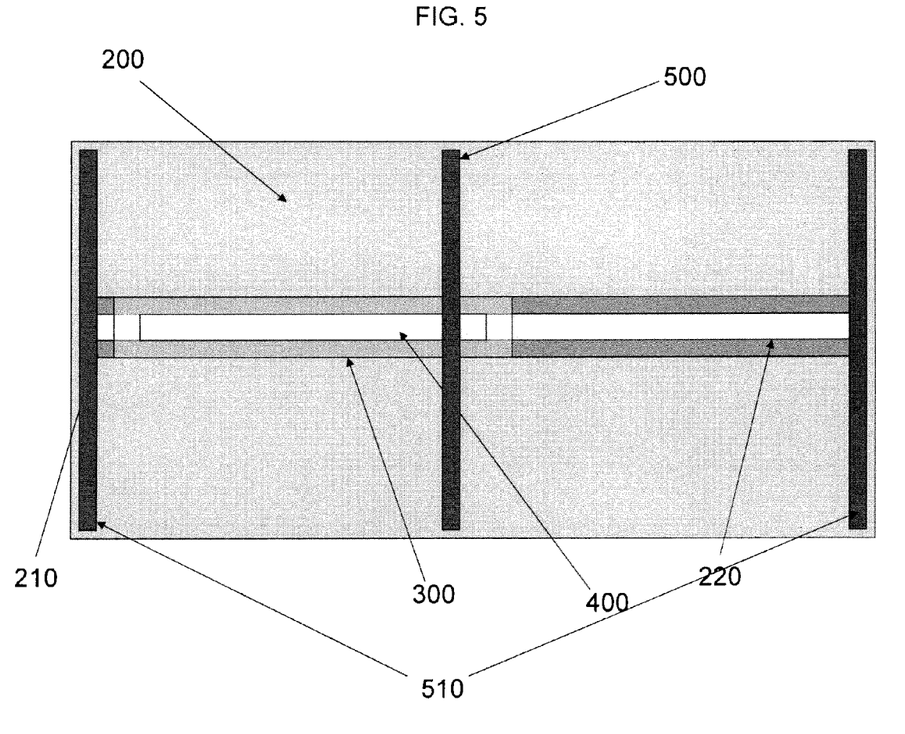
FIG. 5 is a schematic of a photovoltaic module including bus bar assembly.
Figure 6:
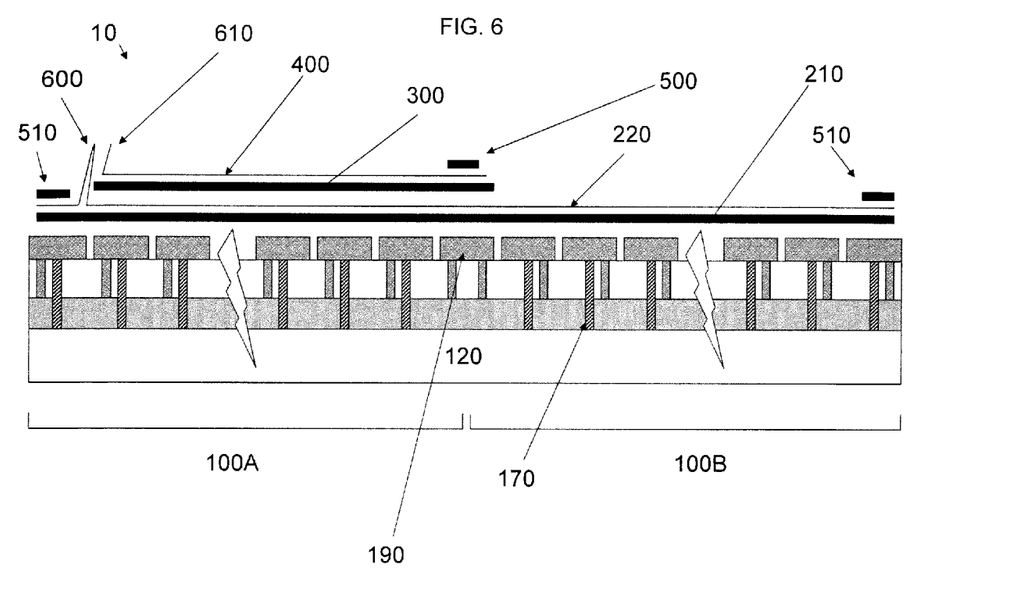
FIG. 6 is a schematic of a photovoltaic module including bus bar assembly.

Referring now to FIG. 4, a second lead foil 400 can be placed on second tape strip 300. Second lead foil 400 can have a length substantially similar to that of second tape strip 300, or it can be substantially or slightly smaller. An end of second tape strip 300 and second lead foil 400 can be positioned substantially proximate to shared cell 190 from FIG. 1. The opposite end of second lead foil 400 can be configured as a lead end suitable for making an electrical connection. For example, as shown in FIG. 6, lead end 610 of second lead foil 400 can be oriented in a manner suitable (for example, directed substantially orthogonally away from the body of photovoltaic module 10) for being electrically connected, for example, to an electrical conductor, such as an electrical cord, with a cord plate adjacent to module 10. Referring to FIG. 5, a plurality of bus bars can be applied to the first and second lead foils. The plurality of bus bars may include three bus bars positioned parallel to one another, and may include a negative bus bar 500 and two positive bus bars 510. Negative bus bar 500 can be positioned on second lead foil 400, and positive bus bars 510 can be positioned on first lead foil 220. Positive bus bars 510 can be positioned substantially equidistant from negative bus bar 500. Each positive bus bar 510 can be positioned substantially proximate to an end of first tape strip 210. For example, each positive bus bar 510 may be positioned at an end of first tape strip 210, about 13 mm from the edge of substrate 120. Each of positive bus bars 510 and negative bus bar 500 may have any suitable width, for example, about 11 mm. Referring to FIG. 6, a portion of first lead foil 220 can be rolled to form a loop 600. Loop 600 can have any suitable length, including for example, above about 20 mm, below about 25 mm, or between about 20 to about 25 mm. Loop 600 may extend in a substantially orthogonal direction away from a top surface of the photovoltaic module. Loop 600 can be divided or cut to form two lead ends, which can be configured in any manner suitable for making an electrical connection. For example, each lead end can be electrically connected, for example, to an electrical conductor, such as an electrical cord or cable, with a cord plate. Lead end 610 of second lead foil 400 can have any suitable length, including a length substantially similar to the length of loop 600. For example, lead end 610 can extend to a length above about 20 mm, below about 25 mm, or between about 20 to about 25.

Photovoltaic devices/modules fabricated using the methods and apparatuses discussed herein may be incorporated into one or more photovoltaic arrays. The arrays may be incorporated into various systems for generating electricity. For example, a photovoltaic module may be illuminated with a beam of light to generate a photocurrent. The photocurrent may be collected and converted from direct current (DC) to alternating current (AC) and distributed to a power grid. Light of any suitable wavelength may be directed at the module to produce the photocurrent, including, for example, more than 400 nm, or less than 700 nm (e.g., ultraviolet light). Photocurrent generated from one photovoltaic module may be combined with photocurrent generated from other photovoltaic modules. For example, the photovoltaic modules may be part of a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A photovoltaic module comprising:
   a transparent conductive layer on a substrate;
   a first submodule comprising a first plurality of photovoltaic cells connected in series;
   a second submodule comprising a second plurality of photovoltaic cells connected in series, wherein the first and second submodules are connected in parallel and contacting the transparent conductive layer through a shared cell;
   a first strip of tape having a length distributed along a contact region on the first and second submodules, the first strip of tape comprising a front surface and a back surface, each surface containing an adhesive;
   a first lead foil distributed along the length of the first strip of tape;
   a second strip of tape, having a length shorter than that of the first strip of tape, distributed along the length and between the ends of the first strip of tape, wherein the second strip of tape comprises a front and back surface, each containing an adhesive;
   a second lead foil, having a length shorter than that of the second strip of tape, distributed along the length of the second strip of tape; and
   a plurality of parallel bus bars comprising three bus bars, positioned adjacent and perpendicular to the first and second strips of tape, wherein each one of the plurality of parallel bus bars contacts one of the first or second lead foils.

2. The photovoltaic module of claim 1, wherein the module comprises between about 140 and about 180 cells.

3. The photovoltaic module of claim 1, wherein each one of the plurality of parallel bus bars is positioned approximately equidistant from at least another one of the plurality of parallel bus bars.

4. The photovoltaic module of claim 1, wherein the plurality of parallel bus bars comprises two positively charged bus bars, and one negatively charged bus bar positioned between the two positively charged bus bars.

5. The photovoltaic module of claim 4, wherein the negatively charged bus bar physically contacts the second lead foil, and wherein the positively charged bus bars physically contact separate portions of the first lead foil.

6. The photovoltaic module of claim 1, wherein each one of the plurality of parallel bus bars comprises a copper.

7. The photovoltaic module of claim 1, wherein each one of the plurality of parallel bus bars comprises a width of more than about 10 mm.

8. The photovoltaic module of claim 1, wherein each one of the plurality of parallel bus bars comprises a width of less than about 13 mm.

9. The photovoltaic module of claim 1, wherein the shared cell is positioned in a center between the first and second submodules.

10. The photovoltaic module of claim 1, wherein the second strip of tape is positioned directly on the shared cell.

11. The photovoltaic module of claim 1, wherein each one of the first and second plurality of photovoltaic cells comprises a cadmium telluride on a cadmium sulfide.

12. The photovoltaic module of claim 1, wherein the first or second strip of tape has a thickness of about 0.0005 inches to about 0.0100 inches.

13. The photovoltaic module of claim 1, wherein the contact region comprises a trench pattern, defining each one of the first and second plurality of photovoltaic cells.

14. The photovoltaic module of claim 13, wherein:
the trench pattern extends substantially through one layer;
the trench pattern extends substantially through two layers; or
the trench pattern extends substantially through three layers.

15. The photovoltaic module of claim 1, wherein at least one of the first or second plurality of photovoltaic cells has a width of about 6 mm to about 10 mm.

16. The photovoltaic module of claim 1, wherein the shared cell has a width of about 10 mm to about 20 mm.

17. The photovoltaic module of claim 1, wherein the first lead foil comprises a loop extending in a substantially orthogonal direction away from a top surface of the photovoltaic module.

18. A method for manufacturing a photovoltaic module, the method comprising:
applying a transparent conductive layer on a substrate;
applying a first strip of tape having a length along a contact region of a first and second submodule connected in parallel through a shared cell, wherein the first submodule comprises a first plurality of photovoltaic cells connected in series, the second submodule comprises a second plurality of photovoltaic cells connected in series, and the first strip of tape comprises a front surface and a back surface, each surface containing an adhesive;
applying a first lead foil along the length of the first strip of tape;
applying a second strip of tape along the length and between the ends of the first strip of tape, the second strip of tape having a length shorter than that of the first strip of tape, wherein the second strip of tape comprises a front and back surface, each containing an adhesive;
applying a second lead foil having a length shorter than that of the second strip of tape, along the length of the second strip of tape; and
applying a plurality of parallel bus bars comprising three bus bars adjacent and perpendicular to the first and second strips of tape, wherein each one of the plurality of parallel bus bars contacts one of the first or second lead foils.

19. The method of claim 18, wherein applying the first strip of tape comprises positioning a strip of tape on one or more contact metals, wherein each one of the first and second plurality of photovoltaic cells comprises a contact metal.

20. The method of claim 18, wherein applying a plurality of parallel bus bars comprises positioning at least one of the plurality of parallel bus bars approximately equidistant from at least another one of the plurality of parallel bus bars.

21. The method of claim 18, further comprising forming a trench pattern in a contact region, wherein the first and second submodules comprise a contact region, and wherein the trench pattern defines each photovoltaic cell in the first and second plurality of photovoltaic cells.

22. The method of claim 21, wherein the forming comprises laser ablation, laser scribing, wet-chemical etching, or dry etching.

23. The method of claim 18, further comprising: forming a loop; and extending the loop in a substantially orthogonal direction away from a top surface of the photovoltaic module, wherein the first lead foil comprises the loop.

24. A photovoltaic module comprising:
a transparent conductive layer on a substrate;
a first submodule comprising a first plurality of photovoltaic cells connected in series;
a second submodule comprising a second plurality of photovoltaic cells connected in series, wherein the first and second submodules are connected in parallel and contacting the transparent conductive layer through a shared cell;
a first strip of tape having a length distributed along a contact region on the first and second submodules, the first strip of tape comprising a front surface and a back surface, each surface containing an adhesive;
a first lead foil distributed along the length of the first strip of tape;
a second strip of tape, having a length shorter than the first strip of tape, distributed along the length and between the ends of the first strip of tape, wherein the second strip of tape comprises a front and back surface, each containing an adhesive;
a second lead foil, having a length shorter than that of the second strip of tape, distributed along the length of the second strip of tape; and
a plurality of parallel bus bars, positioned adjacent and perpendicular to the first and second strips of tape, wherein each one of the plurality of parallel bus bars contacts one of the first or second lead foils;
wherein the contact region comprises a trench pattern, defining each one of the first and second plurality of photovoltaic cells.

25. The photovoltaic module of claim 24, wherein the second strip of tape has a length substantially half the length of the first strip of tape.

26. A photovoltaic module comprising:
a transparent conductive layer on a substrate;
a first submodule comprising a first plurality of photovoltaic cells connected in series;
a second submodule comprising a second plurality of photovoltaic cells connected in series, wherein the first and second submodules are connected in parallel and contacting the transparent conductive layer through a shared cell;

a first strip of tape having a length distributed along a contact region on the first and second submodules, the first strip of tape comprising a front surface and a back surface, each surface containing an adhesive;

a first lead foil distributed along the length of the first strip of tape;

a second strip of tape, having a length shorter than that of the first strip of tape, distributed along the length and between the ends of the first strip of tape, wherein the second strip of tape comprises a front and back surface, each containing an adhesive, wherein at least one of the first and second strip of tape has a thickness of about 0.0005 inches to about 0.0100 inches;

a second lead foil, having a length shorter than that of the second strip of tape, distributed along the length of the second strip of tape; and a plurality of parallel bus bars comprising three bus bars, positioned adjacent and perpendicular to the first and second strips of tape, wherein each one of the plurality of parallel bus bars contacts one of the first or second lead foils.

27. The photovoltaic module of claim 26, wherein at least one of the first or second strip of tape has a thickness of about 0.0010 inches to about 0.0045 inches.

28. The photovoltaic module of claim 27, wherein at least one of the first or second strip of tape has a thickness of about 0.0012 inches to about 0.0020 inches.

* * * * *